United States Patent [19]
Mimoto et al.

[11] Patent Number: 4,715,015
[45] Date of Patent: Dec. 22, 1987

[54] DYNAMIC SEMICONDUCTOR MEMORY WITH IMPROVED SENSE SIGNAL

[75] Inventors: Toshio Mimoto, Nara; Yoshiji Ota, Tenri, both of Japan

[73] Assignee: Sharp Kabushiki Kaisha, Osaka, Japan

[21] Appl. No.: 738,870

[22] Filed: May 29, 1985

[30] Foreign Application Priority Data

Jun. 1, 1984 [JP] Japan .............................. 59-113742
Jun. 4, 1984 [JP] Japan .............................. 59-116310
Jun. 4, 1984 [JP] Japan .............................. 59-116311
Jun. 4, 1984 [JP] Japan .............................. 59-116312
Jun. 4, 1984 [JP] Japan .............................. 59-116313

[51] Int. Cl.$^4$ ............................................. G11C 11/24
[52] U.S. Cl. ..................... 365/210; 365/149; 365/205
[58] Field of Search ............... 365/149, 210, 205, 202

[56] References Cited
U.S. PATENT DOCUMENTS 4,506,351 3/1985 Scheurlein et al. ................ 365/149

Primary Examiner—James W. Moffitt
Attorney, Agent, or Firm—Flehr, Hohbach, Test, Albritton & Herbert

[57] ABSTRACT

A dynamic semiconductor memory comprising memory cells each including a pair of complementary bit lines, a storage capacitor and a device for selecting that capacitor. The memory further comprises a sense amplifier and a control device, and a greater differential voltage can be obtained from these bit lines by varying the ratio of their floating capacitance. Thus, the conventional requirement for balancing the complementary bit lines is eliminated and the lines can be formed in a multilayer structure. This contributes significantly to making the memory cell areas smaller.

8 Claims, 10 Drawing Figures

FIG.—1

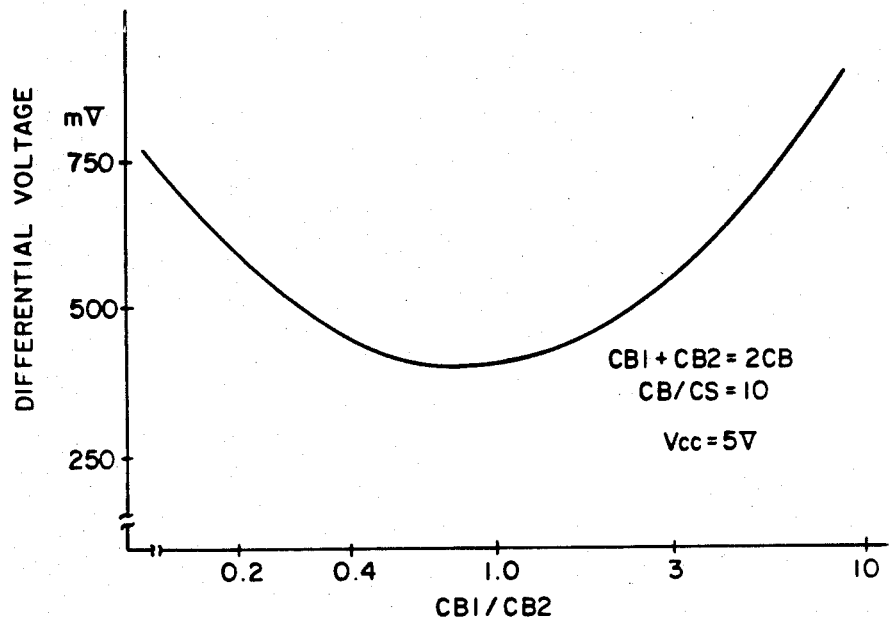
FIG. —4
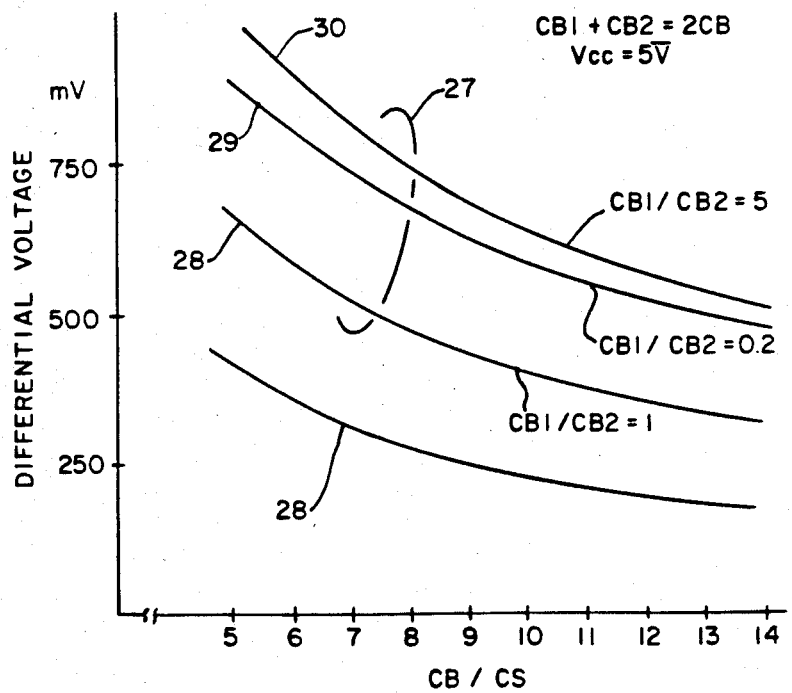
FIG. —5

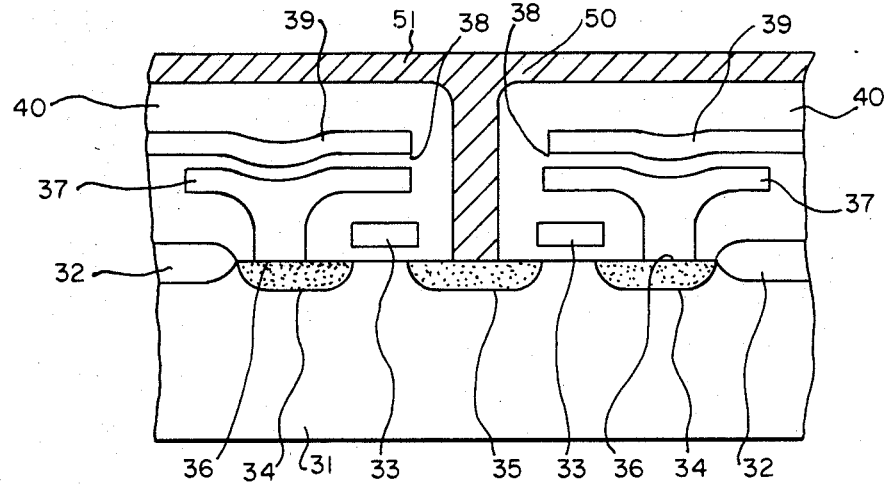
FIG.—6
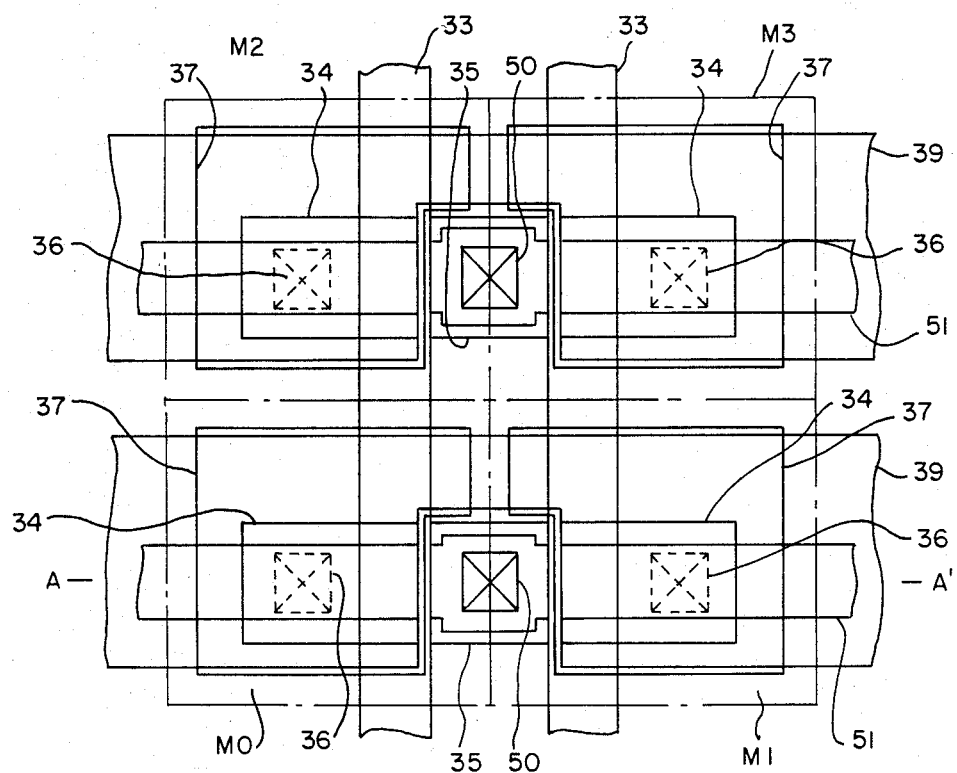
FIG.—7

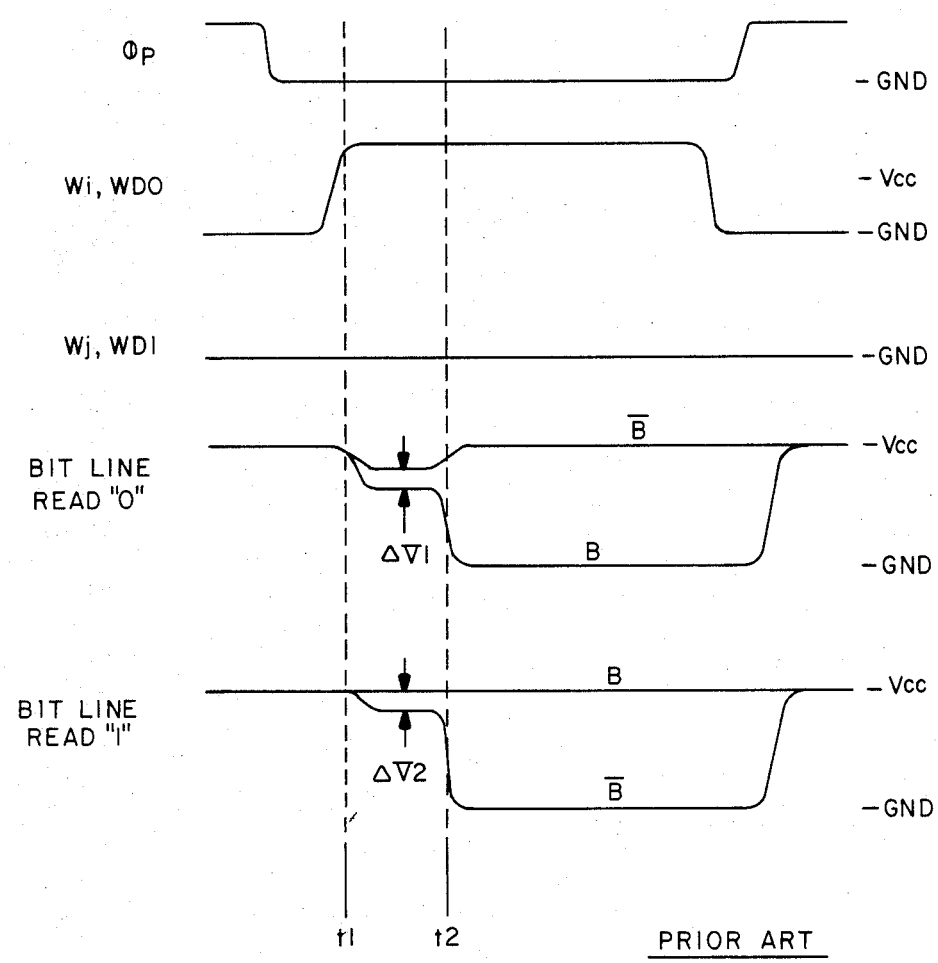
FIG. —10

DYNAMIC SEMICONDUCTOR MEMORY WITH IMPROVED SENSE SIGNAL

This invention relates to an improved dynamic semiconductor memory and more particularly to a dynamic semiconductor memory with a new structure which can improve the capability of dynamic memory elements.

Dynamic memory elements with conventional memory cell structure had problems caused by fluctuations in load capacities of complementary bit lines for input and output of information. The circuit of a conventional type of n-channel MOS dynamic memory element is illustrated in FIG. 9 wherein S is a sense amplifier and numerals 1 and 2 indicate complementary bit lines. Numerals 3 and 3' are memory cells, and numerals 4 and 4' are dummy cells. $W_i$ and $W_j$ are word lines, $W_{D0}$ and $W_{D1}$ are dummy word lines, and $\phi_P$ is a precharge signal. Numerals 5 and 5' are storage capacitors and numerals 6 and 6' are transfer gates for selecting between the storage capacitors 5 and 5' and to connect it electrically to the bit lines 1 and 2. The capacitance of the capacitors 5 and 5' is denoted by $C_S$. Numerals 7 and 7' indicate dummy storage capacitors and their capacitance is denoted by $C_D$. Numerals 8 and 8' are transfer gates for selectively connecting the dummy storage capacitors 7 and 7' to the bit lines 1 and 2. Numerals 9 and 9' are gates for initializing the dummy storage capacitors 7 and 7' during a precharge period. Numerals 10 and 10' are the floating capacitances of the bit lines and their capacitance is denoted by $C_B$.

FIG. 10 is a timing diagram for explaning the operation of FIG. 9. Reference being made to FIG. 9, the dummy cell 4' on the side of the bit line 2 is selected if the memory cell on the side of the bit line 1 is selected while the dummy cell 4 on the side of the bit line 1 is selected if the memory cell on the side of the bit line 2 is selected. In what follows, we shall consider the situation where the word line $W_i$ and the dummy word line $W_{D0}$ are at high voltages and the memory cell 3 and the dummy cell 4' are selected. We shall also assume here that voltages higher than the source voltage $V_{CC}$ are applied to the word line $W_i$ and the dummy word line $W_{D0}$. We shall further assume that the bit lines 1 and 2 are precharged to the source voltage $V_{CC}$ during a precharge period when the precharge signal $\phi_P$ is at a high voltage. For the sake of convenience, the bit lines 1 and 2 are sometimes referred to as B and $\overline{B}$, respectively. The situation where B is at high voltage and $\overline{B}$ is at low voltage will be represented by logical "1" and the reverse situation where B is at low voltage and $\overline{B}$ is at high voltage will be represented by logical "0".

Firstly, in the situation where the ground potential GND is stored in the storage capacitor 5 of the memory cell 3, when an active period starts with the precharge signal $\phi_P$ dropping low and a word line signal is inputted at time $t_1$, the voltage $V_{B1}$ on the bit line 1 becomes $V_{B1}=C_BV_{CC}/(C_B+C_S)$ while the voltage $V_{B2}$ of the bit line 2 on the side of the dummy cell becomes $V_{B2}=C_BV_{CC}/(C_B+C_D)$. Accordingly, the differential voltage inputted to the sense amplifier S is $$\Delta V_1 = V_{B2} - V_{B1}$$
$$= V_{CC}[C_B/(C_B + C_D) - C_B/(C_B + C_S)].$$

Secondly, in the situation where the source potential $V_{CC}$ is stored in the storage capacitor 5 of the memory cell 3, the voltage $V_{B1}$ on the side of the bit line 1 does not change so that $V_{B1}=V_{CC}$, while the voltage $V_{B2}$ of the bit line 2 on the side of the dummy cell becomes $V_{B2}=C_BV_{CC}/(C_B+C_D)$ as before. Accordingly, the differential voltage inputted to the sense amplifier S is $$\Delta V_2 = V_{B2} - V_{B1}$$
$$= V_{CC}[1 - C_B/(C_B + C_D)].$$

If the storage capacitance $C_D$ of the dummy cell is selected in such a manner that the differential voltage inputted to the sense amplifier S will be the same in both of the above situations, the differential voltage inputted to the sense amplifier becomes $$\Delta V = \Delta V_1 = \Delta V_2 = (\tfrac{1}{2})C_SV_{CC}/(C_B+C_S). \qquad \text{Eq. (1)}$$

This differential voltage is amplified to a desired level as the sence amplifier S becomes activated after time $t_2$.

In such a conventional circuit, the balance in load capacitance between the bit lines 1 and 2 is extremely important but fluctuations resulting from production processes are inevitable and it has been difficult to maintain capacity balance between the bit lines 1 and 2. With recent progress in manufacturing technologies, there have been attempts to realize large-scale memory elements but this necessarily reduces the areas of memory cells and this in return tends to reduce the storage capacities inside memory cells. A new problem, therefore, has arisen in that a differential voltage sufficiently large to drive a sense amplifier cannot be obtained. Moreover, as the memory cell areas become smaller, so does the pitch in the bit lines. This may make it impossible to have a control circuit and a sense amplifier contained within a bit line pitch while they are maintaining their capacity balance.

It is therefore an object of the present invention in view of the above to provide a dynamic semiconductor memory which allows the differential voltage inputted to the sense amplifier to become much greater than by the conventional methods even if the storage capacitance is the same as before, or the memory cell areas to become extremely small in order to obtain the same differential voltage as before, without imposing stringent requirements as done before regarding the floating capacity balance of the complementary bit lines so that the degree of freedom is allowed to become very large in designing patterns for large-scale memory elements.

The above and other objects of the present invention are attained by providing a dynamic semiconductor memory comprising first and second bit lines which are complementary to each other, storage capacitor means for storing information, and selecting means for selecting between the aforementioned storage capacitor means. Memory cells are formed with one end of a storage capacitor means connected to the second bit line and the other end of the storage capacitor means connected through a selecting means to the first bit line. There is also included a sense amplifier means for amplifying the differential voltages outputted to the aforementioned first and second bit lines. A control means is provided so that the second bit line, to which the aforementioned storage capacitor means is directly connected, is connected to the sense amplifier means only while the aforementioned differential voltage is inputted to the sense amplifier means and that this second bit line will be disconnected from the sense amplifier means during active periods of the sense amplifier means. Such a control means may include a dummy storage capacitor with one end thereof connected to the first bit line and the other end thereof connected to a terminal for inputting control signals. The aforementioned selecting means may be formed according to an embodiment of the present invention by a MOSFET having first and second diffusion regions on a semiconductor substrate and a first wiring means as a gate electrode. One end of the aforementioned storage capacitor means is formed by a second wiring means and is connected to the second diffusion region through a contact hole while the other end of the storage capacitor means is formed by a third wiring means and the capacitor includes a thin film zone between the second and third wiring means. The first diffusion region and a fourth wiring means are connected by another contact hole to form the memory cell and the aforementioned complementary bit lines are formed by causing the third and fourth wiring means to be shared by a plurality of memory cells. The bit lines according to the present invention are intended to have, or to be allowed to have different floating capacitance and this allows a multi-layer structure as described above. A plurality of pairs of complementary bit lines thus structured can be arranged compactly by disposing their control means and sense amplifiers at the ends of the bit lines.

FIG. 4 is a characteristic curve showing the relationship between the differential signal voltage and the floating capacitance ratio of the bit lines.

FIG. 5 shows the difference in the differential signal voltage between the conventional and present methods.

FIG. 6 is a cross-sectional view of a memory cell structure embodying the present invention as seen along the line A—A' of FIG. 7.

FIG. 7 is a plan view of the memory cell structure of FIG. 6.

FIG. 10 is a timing diagram for explaining the operation of the conventional memory element of FIG. 9.

Figure 1:
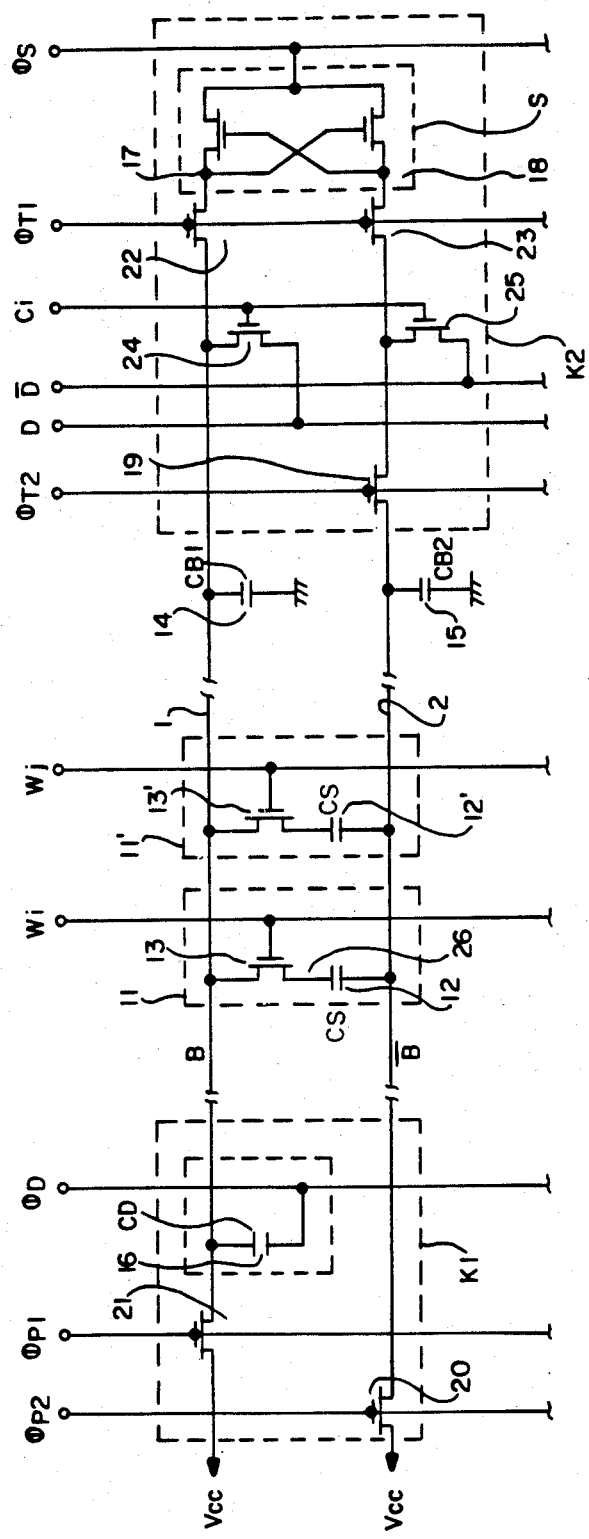
FIG. 1 is a circuit diagram of a dynamic semiconductor memory made of n-channel MOS circuits according to an embodiment of the present invention.
Figure 9:
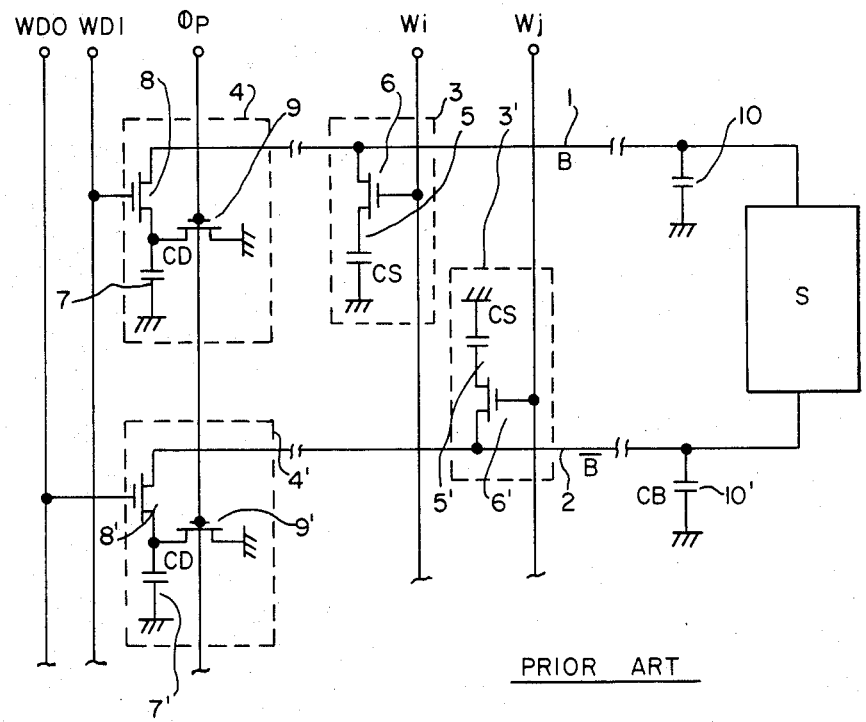
FIG. 9 is a circuit diagram of a conventional dynamic memory element.

FIG. 1 is a circuit diagram of a dynamic semiconductor memory made of n-channel MOS circuits. Components identical to those shown in FIG. 9 are assigned like numerals. Reference being made to FIG. 1, numerals 11 and 11' are memory cells of the present invention. $W_i$ and $W_j$ are word lines on which signals with amplitudes greater than the source voltage $V_{CC}$ are adapted to be applied. Numerals 12 and 12' are storage capacitors, one end of each being connected to the second bit line 2 while the other end of each is connected to the first bit line 1 through the source-drain route of either transfer gate 13 or 13', each adapted to select a desired memory cell. The gate of the transfer gate 13 is connected to the word line $W_i$, while the gate of the transfer gate 13' is connected to the word line $W_j$. Numerals 14 and 15 indicate respectively the floating capacitance of the first and second bit lines 1 and 2. The storage capacitance of the memory cell storage capacitors 12 and 12' is indicated by $C_S$. The capacitance on the side of the first bit line 1 is indicated by $C_{B1}$ and that on the side of the second bit line 2 by $C_{B2}$. In order to clearly describe the features of the present invention, we shall assume that $C_{B1}$ and $C_{B2}$ are different from each other.

Numeral 16 indicates a dummy storage capacitor with one of its ends connected to the first bit line 1 and the other end connected to a dummy control signal $\phi_D$. Numerals 17 and 18 are sense input terminals of the sense amplifier S, and numeral 19 is a MOS field effect transistor (to be abbreviated as MOSFET). The source-drain route of this MOSFET 19 is placed between the second bit line 2 and the sense input terminal 18 so that the latter two become electrically connected to each other by the application of a second control signal $\phi_{T2}$ only during a period when the voltage of the second bit line 2 is inputted to the input terminal 18 of the sense amplifier S.

Numeral 20 is a MOSFET, of which the source-drain route is placed between the second bit line 2 and a source voltage $V_{CC}$ so that the second bit line 2 will be maintained at the source voltage level $V_{CC}$ by the application of a second precharge signal $\phi_{P2}$ during a wait period, a precharge period, a write period or an active period of the sense amplifier S. Numeral 21 is another MOSFET for precharging a bit line. Its source-drain route is placed between the first bit line 1 and the source $V_{CC}$ so that the first bit line 1 is maintained at the source voltage level $V_{CC}$ during a precharge period by the application of a first precharge signal $\phi_{P1}$. Numerals 22 and 23 are conventionally used transfer gates between the bit lines and the sense amplifier. They perform the function of temporarily disconnecting the sense amplifier S from the bit lines from a first control signal $\phi_{T1}$ during the early part of a sense amplitude driving period in order to improve the sensitivity.

Numerals 24 and 25 are MOSFETs for selecting desired complementary bit lines. Information is inputted and outputted by a line selecting signal $C_i$ which causes a desired pair of bit lines and data buses D and $\overline{D}$ to be electrically connected. In FIG. 1, the parts K1 and K2 surrounded by broken lines are control means for processing electrical data in pairs from the complementary bit lines 1 and 2. In what follows, we shall explain the activity of the circuit for a situation in which the memory cell 11 is selected. Logical "0" and logical "1" mean the same as defined before.

Figure 2:
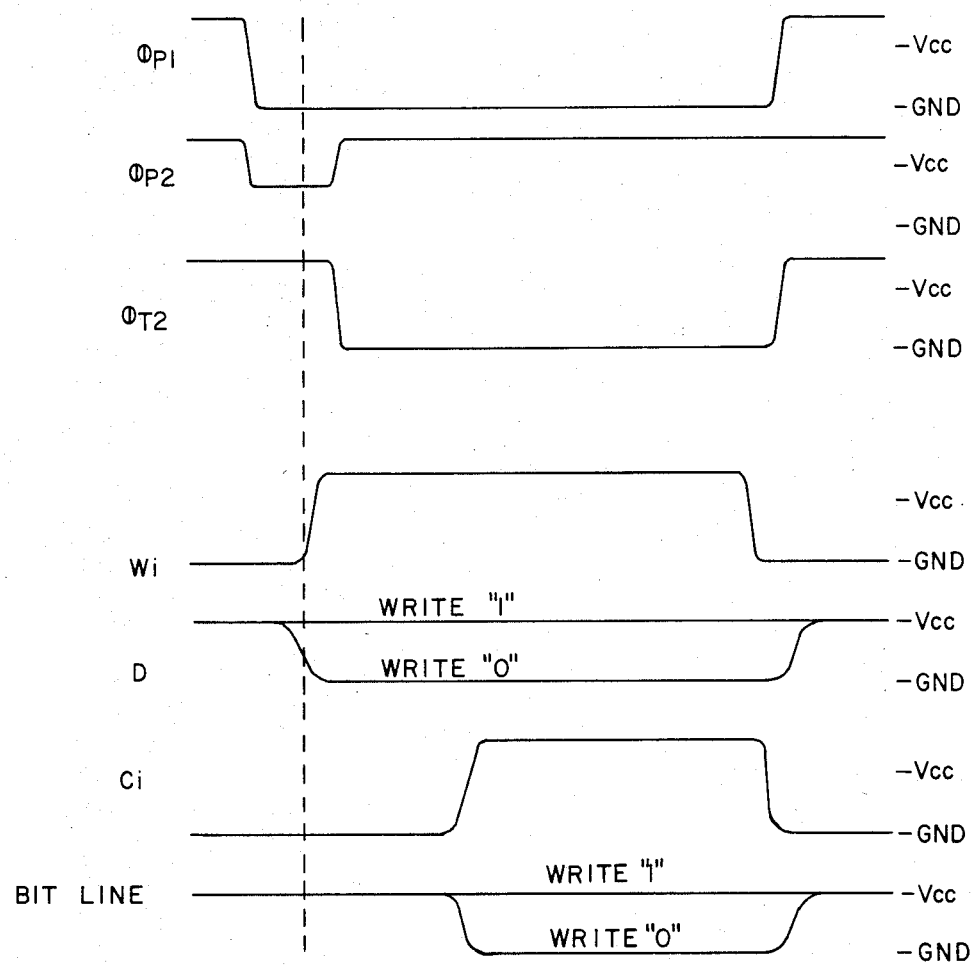
FIG. 2 is a timing diagram in a "write" cycle.

FIG. 2 shows a timing diagram for the case of writing logical "1" and logical "0". At the end of a precharge period, the first and second precharge signals $\phi_{P1}$ and $\phi_{P2}$ drop, the word line $W_i$ subsequently rises to a level beyond the source voltage $V_{CC}$ and reading is started. If this active period is in a write cycle, however, data to be written are outputted to the data bus D. After the second precharge signal $\phi_{P2}$ rises above the level of the source voltage $V_{CC}$ to switch on the MOSFET 20 and to maintain the second bit line 2 at the source voltage $V_{CC}$ while the second control signal $\phi_{T2}$ drops to the ground level GND to switch off the MOSFET 19 and to disconnect the bit line 2 from the sense amplifier S, the line selecting the signal $C_i$ rises to a level higher than the source voltage $V_{CC}$ to switch on the MOSFETs 24 and 25. At this point, the data bus D becomes electrically connected to the first bit line 1 and the write data on the data bus D are outputted to the first bit line 1 and are stored at the node 26 of the memory cell 11 through the transfer gate 13.

In the case of writing logical "1" the source voltage is on the data bus D so that the source voltage $V_{CC}$ is stored at the node 26 of the memory cell 11. In the case of writing logical "0", on the other hand, the ground potential is outputted on the data bus D so that the ground potential GND is stored at the node 26 of the memory cell 11. In the meantime, the data on the data bus $\overline{D}$ do not participate in the writing into the memory cell because the MOSFET 19 is switched off and the data bus $\overline{D}$ and the second bit line 2 are electrically disconnected.

Figure 3:
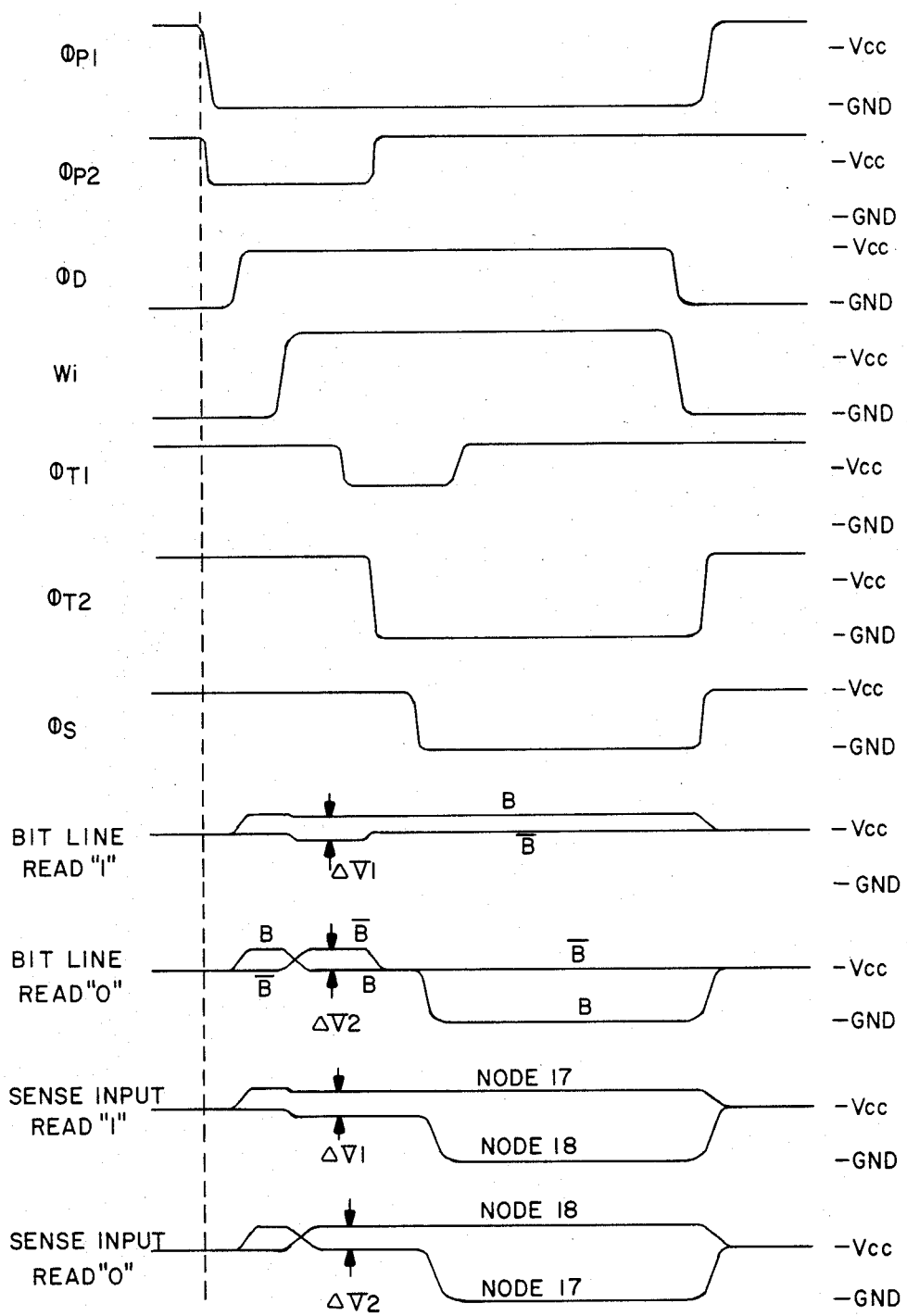
FIG. 3 is a timing diagram in a "read" cycle.

FIG. 3 shows a timing diagram in the case of reading logical "1". At the end of a precharge period, the first precharge signal $\phi_{P1}$ drops to the ground potential level GND and the second precharge signal $\phi_{P2}$ drops to a sufficiently low level so that the MOSFET 20 can be switched off reliably. The bit lines 1 and 2 are disconnected from the source and begin to "float". Next, the dummy driving signal $\phi_D$ is raised to the level of the source voltage $V_{CC}$ so that the voltage on the side of the first bit line will be slightly above the source voltage $V_{CC}$ by the capacitive connection of the dummy storage capacitor 16.

Thereafter, a selection signal higher than the source voltage $V_{CC}$ is inputted to the word line $W_i$ and the bit lines 1 and 2 become capacitively connected by the storage capacitor 12 through the transfer gate 13. Since the node 26 of the memory cell 11 is maintained at the source voltage, the voltages of the bit lines 1 and 2 can change only a little on the lower voltage side; no voltage inversion can take place between the bit lines 1 and 2. The differential voltage between the bit lines 1 and 2 at this moment becomes $$\Delta V_1 = (1/Y) C_D V_{CC}/(C_{B1}+C_D) \quad \text{Eq. (2)}$$

where $$Y = 1 + C_S/C_{B2} + C_S/(C_{B1}+C_D).$$

This differential voltage is inputted to the input terminals 17 and 18 of the sense amplifier S.

Next, after the first control signal $\phi_{T1}$ drops to a predetermined level to disconnect the sense amplifier S from the bit lines 1 and 2, the second control signal $\phi_{T2}$ drops to the ground potential level GND while the second precharge signal $\phi_{P2}$ rises again to a level higher than the source voltage $V_{CC}$ to switch on the MOSFET 20. The second bit line 2 thus becomes fixed at the source voltage $V_{CC}$. Subsequently, the sense amplifier driving signal $\phi_S$ drops to the ground potential level and the aforementioned differential voltage inputted to the sense amplifier S becomes amplified to a desired voltage. In this situation, the node 26 of the memory cell 11 is maintained at a high voltage. There is no need for rewriting.

FIG. 3 also includes timing diagrams for reading logical "0". The processes up to the input of the selection signal to the word line $W_i$ are the same as described above for the case of reading logical "1". Since the node 26 of the memory cell 11 is initially at the ground potential level GND in this case, however, the voltage of the first bit line 1 drops and that of the second bit line 2 rises when the selection signal switches on the transfer gate 13. This causes a potential inversion between the bit lines 1 and 2. In this situation, the differential voltage between the bit lines 1 and 2 is $$\Delta V_2 = (V_{CC}/Y)[C_S/C_{B2}+(C_S-C_D)/(C_{B1}+C_D)] \quad \text{Eq. (3)}$$

This differential voltage is inputted to the input terminals 17 and 18 of the sense amplifier S.

Next, as done before in the case of reading logical "1", the first control signal $\phi_{T1}$ drops to a predetermined level to disconnect the sense amplifier S from the bit lines 1 and 2 and then the second control signal $\phi_{T2}$ drops to the ground potential level GND. The second precharge signal $\phi_{P2}$ rises again to a level higher than the source voltage $V_{CC}$ to switch on the MOSFET 20 and the second bit line 2 becomes fixed at the source voltage $V_{CC}$. Thereafter, the sense amplifier driving signal $\phi_S$ drops to the ground potential level GND and the aforementioned differential voltage inputted to the sense amplifier S is amplified to a desired voltage level while the first bit line 1 is discharged to the ground potential level through the MOSFET 22. The ground potential GND is thereby rewritten at the node 26 of the memory cell 11.

If the capacitance $C_D$ of the dummy storage capacitor is set in such a manner that the differential voltages $\Delta V_1$ and $\Delta V_2$ for cases of reading logical "1" and "0" will be equal to each other, $C_D = C_S(C_{B1}+C_{B2})/(2C_{B2}-C_S)$ and both Eqs. (2) and (3) become $$\Delta V = \Delta V_1 = \Delta V_2 = V_{CC}C_S(C_{B1}+C_{B2})/[ZC_{B2}(2C_{B1}+C_S)]$$

where $$Z = 1 + C_S/C_{B2} + (C_S/C_{B2})[(2C_{B2} - C_S)/(2C_{B1} + C_S)]. \quad \text{Eq. (4)}$$

If we set $C_{B1} + C_{B2} = 2C_B$ in Eqs. (1) and (4) to clearly demonstrate the characteristics of the present invention by comparing with results by the conventional method, we obtain curves shown in FIGS. 4 and 5. FIG. 4 shows the relationship between the differential signal voltage and the ratio $C_{B1}/C_{B2}$ of floating voltages of the bit lines 1 and 2 when $C_B/C_S = 10$. Since it clearly shows that the differential signal voltage increases as the difference between $C_{B1}$ and $C_{B2}$ of the bit lines 1 and 2 increases when the sum of $C_{B1}$ and $C_{B2}$ is held constant, the floating capacitance of one of the bit lines must be made as small as possible in order to utilize the features of the present invention to a maximum degree.

This is a significantly advantageous characteristic. While the floating capacitance of the complementary bit lines must match as exactly as possible according to the conventional method, this requirement is no longer applicable. The degree of freedom in pattern designs is hereby greatly increased.

FIG. 5 also shows the characteristic curves of differential signal voltage when the ratio $C_B/C_S$ is varied under the condition $C_{B1} + C_{B2} = 2C_B$. Numeral 28 is the conventional characteristic curve obtained from Eq. (1) and numeral 27 shows curves obtained from Eq. (4) according to the present invention. Although FIG. 4 shows that the differential signal voltage takes a minimum value when $C_{B1}/C_{B2}$ is in the neighborhood of 1.0 according to this particular embodiment of the present invention, the curve 28 of FIG. 5 shows that even under this least favorable condition, the differential signal voltage obtained by the present method is greater by a factor of 1.5 to 2.0. If the ratio $C_{B1}/C_{B2}$ between the bit lines 1 and 2 is adjusted, furthermore, improved results shown by curves 29 and 30 can be obtained. In short, the present invention makes it possible to increase the differential signal voltage without changing the storage capacitance of the memory cells. This method, therefore, is extremely useful in designing large-scale memory elements.

FIGS. 6 and 7 show the structure of a memory cell of the present invention in the dynamic semiconductor memory of FIG. 1. FIG. 6 is a cross-sectional view seen in the direction of the line A—A' of FIG. 7. FIG. 7 is actually a pattern diagram including four memory cells $M_0$–$M_3$. In an actual memory element, a pattern shown here is repeated as many times as necessary. In what follows, the memory cell structure of the present invention will be explained for the case of an n-channel MOS process.

After separation regions 32 are created on the top surface of a p-type silicon substrate 31 by means of a selective oxidation method or the like, a first wiring means 33 is used to form word lines and transfer gates. Next, diffusion regions 34 and 35 which will later become sources and drains of MOSFETs are formed by a method such as ion implantation.

Next, after contact windows 36 are opened at the drain sections 34 of transfer gate parts, a second wiring means is used to form a first set of electrodes 37 of the storage capacitors. They are connected through the contact windows 36 to the drain sections 34 of the transfer gate parts.

Regarding the above, the electrodes 37 by the second wiring means may also be formed on the upper surface of the first wiring means 33, and this contributes greatly to the increasing of the storage capacity of the memory cells. After a thin insulative film 38 is formed on the upper surface of the second wiring means for storage capacitors, a third wiring means 39 is used to form the other set of electrodes of the aforementioned storage capacitors. Another insulative film 40 is then formed. Next, after ordinary contact windows 50 are opened, a fourth wiring means 51 is formed and contacts are established through the contact windows 50 to the source areas 35 of the transfer gate parts.

Ordinary polysilicons, silicides and metals with high melting points are generally used for the first through third wiring means. The fourth wiring means is commonly formed with aluminum.

The fourth wiring means 51 and the third wiring means 39 are both shared by a plurality of memory cells, forming individual complementary bit lines. In other words, since the circuit is designed according to the present invention in such a manner that different ratios of distribution of floating capacitance will be made, or will be allowed between the two bit lines 1 and 2, the mutually complementary bit lines 1 and 2 can be formed by a multi-layer structure of wiring means of different materials. Unlike the conventional design according to which complementary bit lines are formed with the same wiring means, the present design allows the memory cell areas to be smaller. Moreover, the diffusion regions 34 and 35 will be considered sufficiently large if contact windows 36 and 50 can be formed. Thus, the memory cells require smaller diffusion regions and this increase resistance against alpha-rays and contributes to the development of stable memory elements.

Figure 8:
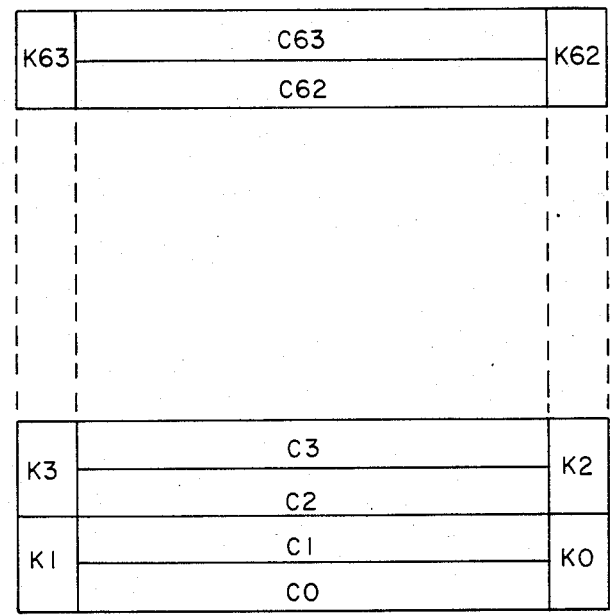
FIG. 8 is a conceptual diagram for explaining the distribution of the complementary bit lines, the control circuit and the sense amplifier according to an embodiment of the present invention.

FIG. 8 shows an example of memory cell arrays according to an embodiment of the present invention. It has already been explained that memory cell areas can be significantly reduced according to the present invention. On the other hand, however, relatively large areas become necessary for the control circuits and the sense amplifiers connected to the bit lines. This gives rise to the problem that circuits may not fit within the bit line pitch.

According to the present invention, therefore, such control circuits and sense amplifiers belonging to a single bit line pair or a plurality of pairs are disposed at the ends of the individual bit line pairs. FIG. 8 shows an example of memory arrays thus positioned. In this figure, $C_0$–$C_{63}$ are each a complementary bit line pair and $K_0$–$K_{63}$ are each a control circuit, a sense amplifier, etc. belonging to the respective complementary bit line pairs $C_0$–$C_{63}$.

For example, the control section $K_0$ including control circuits and a sense amplifier belonging to the first pair of complementary bit lines $C_0$ is disposed at the right-hand end of the bit line pair $C_0$, while the control section $K_1$ belonging to the second pair of complementary bit lines $C_1$ is disposed at the left-hand end of the bit line pair $C_1$. Thereafter, the control sections are alternately disposed at the right-hand or left-hand end of each bit line pair. This construction scheme allows the memory cell areas to remain small as a whole in spite of the control sections which require relatively large areas compared to the memory cells.

The present invention has been explained above in terms of a limited number of examples but the description given above is not intended to limit the scope of the invention. For example, although the n-channel MOS process was used to illustrate this invention, the present invention can be applied equally well to the p-channel MOS process, CMOS process, or SOI process, etc. Although FIG. 8 shows an arrangement whereby all control means belonging to one bit line pair are at one end, they may be separated as shown in FIG. 1 and disposed alternately at both ends as shown in FIG. 8. The arrangement as described above may be effected regarding only a part of the control means. The scope of this invention is defined only by the following claims.

What is claimed is:

1. A dynamic semiconductor memory comprising memory cells, each including a first bit line and a second bit line for inputting and outputting information, said first and second bit lines being complementary to each other, a storage capacitor means for storing information and a selecting means for selecting said storage capacitor means, one end of said storage capacitor means being connected to said second bit line and the other end of said storage capacitor means being connected through said selecting means to said first bit line, a sense amplifier means for amplifying a differential voltage outputted to said complementary first and second bit lines, a control means adapted to connect said sense amplifier means and said second bit line only during a period when said differential voltage is inputted to said sense amplifier means and to disconnect said second bit line from said sense amplifier means during an active period of said sense amplifier means, and a dummy storage capacitor with one end connected to said first bit line and the other end connected to a dummy control signal line.

2. The dynamic semiconductor memory of claim 1 wherein said second bit line is adapted to stay at a predetermined voltage independent of input or output information during an active period of said sense amplifier means.

3. The dynamic semiconductor memory of claim 1 wherein said second bit line is adapted to stay at a predetermined voltage independent of input or output information during a wait period and/or a period when information is being inputted to a specified memory cell.

4. The dynamic semiconductor memory of claim 1 wherein said control means includes a dummy storage capacitor adapted to take out said differential voltage, one end of said dummy storage capacitor being connected only to said first bit line and the other end of said dummy storage capacitor being connected to a terminal for inputting control signals.

5. A dynamic semiconductor memory comprising a plurality of memory cells, each including a first bit line and a second bit line for inputting and outputting information, said first and second bit lines being complementary to each other, a storage capacitor means for storing information and a selecting means for selecting said storage capacitor means, one end of said storage capacitor means being connected to said second bit line and the other end of said storage capacitor means being connected through said selecting means to said first bit line, said selecting means being formed by a MOSFET having a first diffusion region and a second diffusion region separate from each other on a semiconductor substrate surface and having a first wiring means as the gate electrode thereof, one end of said storage capacitor means being formed by a second wiring means and connected to said second diffusion region through a contact hole, the other end of said storage capacitor means being formed by a third wiring means, said second and third wiring means having a thin film region therebetween to form a desired storage capacitor, said first diffusion region and a fourth wiring means being connected through another contact hole, and said third and fourth wiring means being shared among said plurality of memory cells to form said complementary first and second bit lines, said first bit line being connected to one end of a dummy storage capacitor, the other end of said capacitor being connected to a dummy control signal line.

6. A dynamic semiconductor memory comprising memory cells, each including a first bit line and a second bit line for inputting and outputting information, said first and second bit lines being complementary to each other, a storage capacitor means for storing information and a selecting means for selecting said storage capacity means, one end of said storage capacity means being connected to said second bit line and the other end of said storage capacitor means being connected through said selecting means to said first bit line, said first and second bit lines being formed on a semiconductor substrate in such a manner that there is, or is allowed to be a difference in floating capacitance between said first and second bit lines, said first bit line being connected to one end of a dummy storage capacitor, the other end of said capacitor being connected to a dummy control signal line.

7. The dynamic semiconductor memory of claim 6 wherein said first and second bit lines are of different materials and form a multi-layer structure.

8. A dynamic semiconductor memory comprising a plurality of bit line pairs, each bit line pair including a first bit line and a second bit line for inputting and outputting information, said first and second bit lines being complementary to each other, said first bit line being connected to one end of a dummy storage capacitor, the other end of said dummy storage capacitor being connected to a dummy control signal line, memory cells each corresponding to one of said bit line pairs, each memory cell including a storage capacitor means for storing information and a selecting means for selecting said storage capacitor means, one end of said storage capacitor means being connected to the second bit line of the corresponding one of said bit line pairs and the other end of said storage capacitor means being connected through said selecting means to the first bit line of said corresponding one of said bit line pairs, amplifier means connected individually to said bit line pairs for amplifying signals outputted to the corresponding one of said bit line pairs, and control means connected individually to said bit line pairs, said bit line pairs being sequentially arranged adjacent to one another defining two end positions, and a part or all of said control and amplifier means corresponding to said bit line pairs being disposed alternately on both of said two end positions of said bit line pairs.

* * * * *

UNITED STATES PATENT AND TRADEMARK OFFICE
CERTIFICATE OF CORRECTION

PATENT NO. : 4,715,015
DATED : December 22, 1987
INVENTOR(S) : Toshio Mimoto, et al.

It is certified that error appears in the above—identified patent and that said Letters Patent is hereby corrected as shown below:

Column 2, about line 28, change "sence" to --sense--.

Column 5, about line 30, delete " 1 " and insert --"1",--.

Column 5, Eq. (2) should read $--\Delta V_1=(1/Y)C_D V_{CC}/(C_{B1}+C_D)--$.

Signed and Sealed this

Twentieth Day of September, 1988

Attest:

DONALD J. QUIGG

Attesting Officer      Commissioner of Patents and Trademarks